(12) United States Patent
Grebner

(10) Patent No.: US 7,870,447 B2
(45) Date of Patent: Jan. 11, 2011

(54) METHOD AND SYSTEM FOR CARRYING OUT A PROCESS ON AN INTEGRATED CIRCUIT

(75) Inventor: Thomas Grebner, Freising (DE)

(73) Assignee: Qimonda AG, Munich (DE)

( * ) Notice: Subject to any disclaimer, the term of this patent is extended or adjusted under 35 U.S.C. 154(b) by 1444 days.

(21) Appl. No.: 11/288,961

(22) Filed: Nov. 28, 2005

(65) Prior Publication Data

US 2006/0123399 A1    Jun. 8, 2006

(30) Foreign Application Priority Data

Nov. 29, 2004    (DE) .................... 10 2004 057 489

(51) Int. Cl.
  G01R 31/28    (2006.01)
  G01R 31/00    (2006.01)
  G01N 37/00    (2006.01)
  G01M 19/00    (2006.01)
(52) U.S. Cl. .................. 714/724; 702/81; 702/118; 702/119; 702/123; 700/110
(58) Field of Classification Search ............... 714/724; 702/81, 118, 119, 123; 700/110
  See application file for complete search history.

(56) References Cited

U.S. PATENT DOCUMENTS

| | | | |
|---|---|---|---|
| 6,240,329 B1 * | 5/2001 | Sun | 700/110 |
| 7,181,707 B2 * | 2/2007 | Kotani et al. | 716/5 |
| 2004/0103083 A1 * | 5/2004 | Gaur et al. | 707/3 |
| 2004/0220968 A1 * | 11/2004 | Hellig et al. | 707/104.1 |
| 2005/0004827 A1 * | 1/2005 | Steinkirchner et al. | 705/8 |

FOREIGN PATENT DOCUMENTS

| | | |
|---|---|---|
| DE | 102 52 606 A1 | 5/2004 |
| DE | 103 19 496 A1 | 11/2004 |

* cited by examiner

*Primary Examiner*—John J Tabone, Jr.
(74) *Attorney, Agent, or Firm*—Dickstein Shapiro LLP

(57) ABSTRACT

System and method for carrying out a process on an integrated circuit. The method includes reading a data key including subkeys, determining a process parameter set using a parameter directory in a manner dependent on the data key read in, and setting the parameters required for the process in accordance with the process parameter set determined. The parameter directory includes rule keys each having subkeys, which are each assigned predeterminable values from a plurality of values, and at least one subkey is assigned a wildcard, and a plurality of process parameter sets each respectively assigned at least one rule key. The step of determining a parameter set includes comparing the data key read in with the rule keys stored in the parameter directory, determining the rule key(s) whose subkeys match those of the data key read in, and outputting the process parameter set(s) assigned to the rule key(s) determined.

7 Claims, 2 Drawing Sheets

METHOD AND SYSTEM FOR CARRYING OUT A PROCESS ON AN INTEGRATED CIRCUIT

CROSS-REFERENCE TO RELATED APPLICATION

Figure 1:
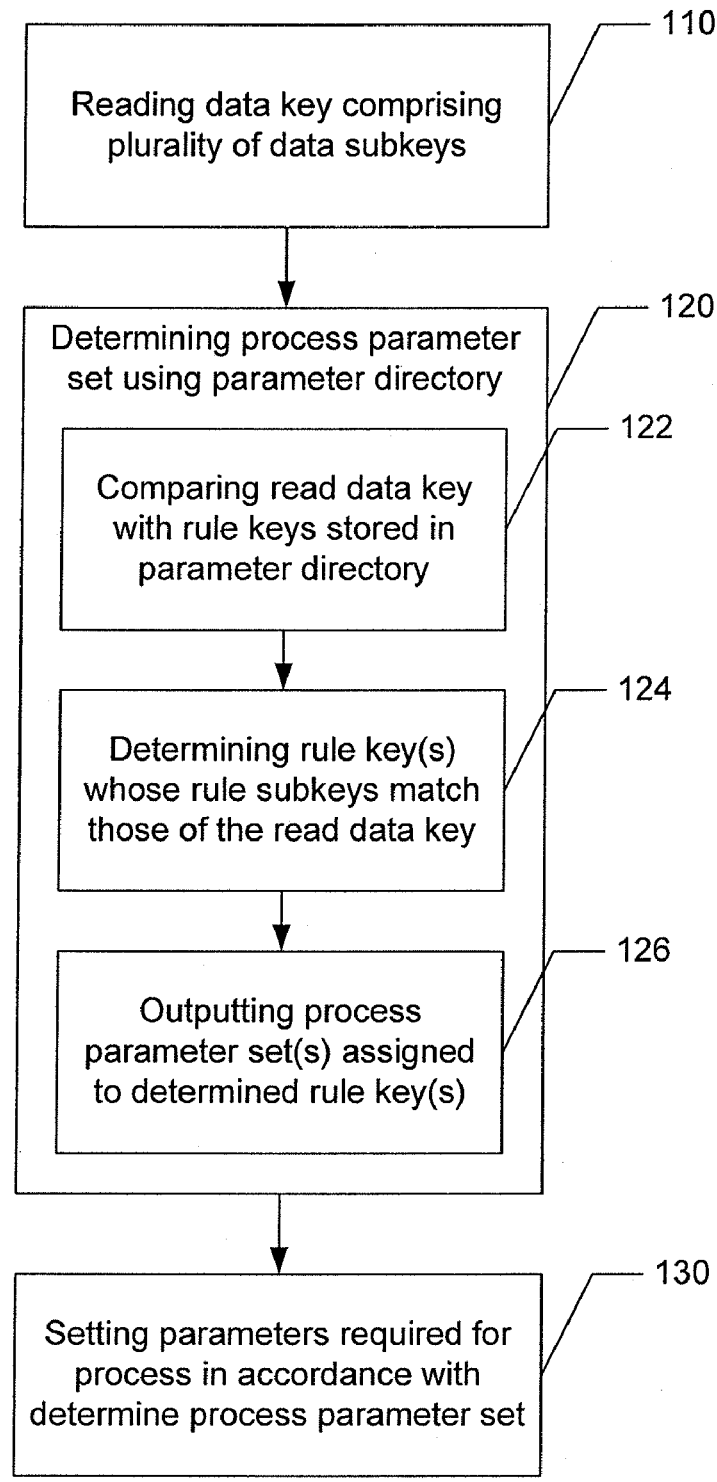

This application claims priority to German Patent Application Serial No. 10 2004 057 489.8, which was filed on Nov. 29, 2004, and is incorporated herein by reference in its entirety.

FIELD OF THE APPLICATION

The present application relates to a method and a system for carrying out a process, in particular a test process on an integrated circuit.

BACKGROUND

When testing integrated circuits, in particular semiconductor memory devices, for devices of different configurations it is necessary to set different test parameters in the tester. In order to enable a multiplicity of different devices to be tested automatically, the different test parameters for the different devices are stored within the program text of the test program. In particular, the test parameters are in this case organized into individual data blocks which are delimited by if statements and assigned by means of the conditional relations imparted therein.

This procedure has the disadvantage, however, that if test parameters for a specific device have to be changed or test parameters for a new device have to be added, a complicated alteration of the test program text is necessary.

IN THE DRAWINGS

Figure 2:
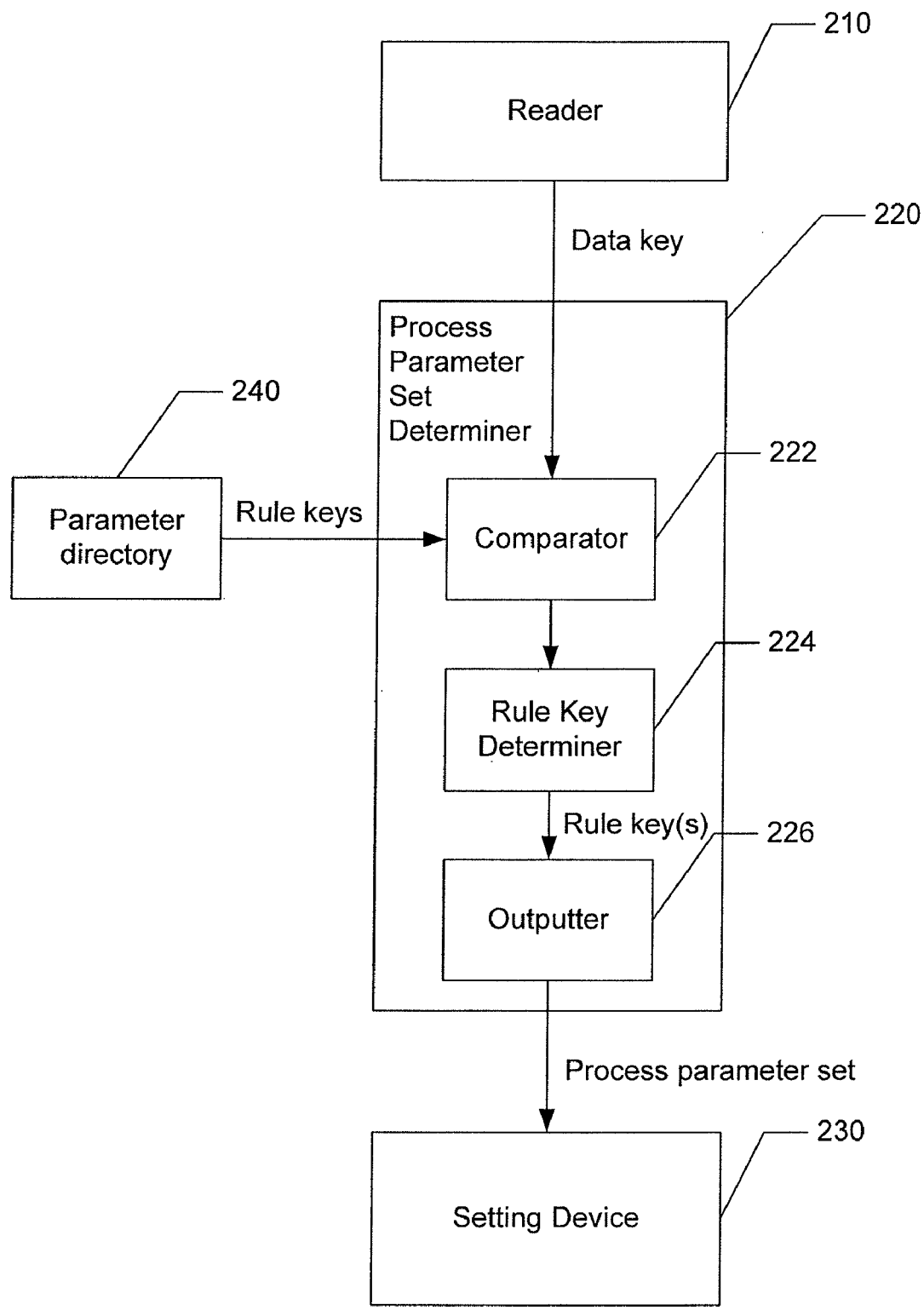

FIG. 1 illustrates a method for carrying out a process on an integrated circuit; and FIG. 2 illustrates a system for carrying out a process on an integrated circuit.

SUMMARY

A method for carrying out a process on an integrated circuit. The method includes reading in a data key comprising a plurality of subkeys, determining a process parameter set using a parameter directory in a manner dependent on the data key read in, and setting the parameters required for the process in accordance with the process parameter set determined. The parameter directory includes a plurality of rule keys each comprising a plurality of subkeys, the subkeys each being assigned predeterminable values from a plurality of values, and at least one subkey of at least one rule key being assigned a wildcard which can assume all the predeterminable values possible for the respective subkey. The parameter directory also includes a plurality of process parameter sets, each process parameter set respectively assigned at least one rule key. The step of determining a process parameter set includes the steps of comparing the data key read in with the rule keys stored in the parameter directory, determining the rule key(s) whose subkeys match those of the data key read in, and outputting the process parameter set(s) assigned to the rule key(s) determined.

A system for carrying out a process on an integrated circuit. The system includes a reader adapted to read in a data key comprising a plurality of subkeys, a process parameter set determiner adapted to determine a process parameter set using a parameter directory in a manner dependent on the data key read in, and a setting device adapted to set the parameters required for the process in accordance with the process parameter set determined. The parameter directory includes a plurality of rule keys each comprising a plurality of subkeys, the subkeys each being assigned predeterminable values from a plurality of values, and at least one subkey of at least one rule key being assigned a wildcard which can assume all the predeterminable values possible for the respective subkey. The parameter directory also includes a plurality of process parameter sets, each process parameter set respectively being assigned at least one rule key. The process parameter set determiner further includes a comparator adapted to compare the data key read in with the rule keys stored in the parameter directory, a rule key determiner adapted to determine the rule key(s) whose subkeys match those of the data key read in, and a outputter adapted to output the process parameter set(s) assigned to the rule key(s) determined.

DETAILED DESCRIPTION

This application provides a method and a system for carrying out a process, in particular a test process, on an integrated circuit which enable a simple management of process parameters.

FIG. 1 illustrates a method for carrying out a process, in particular a test, on an integrated circuit. The method comprises:

reading in a data key comprising a plurality of subkeys (step 110;

determining a process parameter set using a parameter directory in a manner dependent on the read data key (step 120); and setting the parameters required for the process in accordance with the determined process parameter set (step 130), wherein the parameter directory comprises:
a plurality of rule keys each comprising a plurality of subkeys, the subkeys each being assigned predeterminable values from a plurality of values, and at least one subkey of at least one rule key being assigned a wildcard which can assume all the predeterminable values possible for the respective subkey; and a plurality of process parameter sets, each process parameter set respectively assigned at least one rule key;

wherein the step of determining a process parameter set comprises:

comparing the data key read in with the rule keys stored in the parameter directory (step 122);

The subkeys preferably specify properties of the integrated circuit. Furthermore, the subkeys may relate to the circumstances or conditions of the process to be carried out or to ambient parameters.

The parameter directory is preferably stored externally or outside the actual process program. Consequently, the process parameters stored therein can be changed or new ones added in a simple manner.

The subkeys of the rule keys, which are each assigned predeterminable values from a plurality of values, may also be referred to as specified subkeys. Furthermore, subkeys which are assigned a wildcard may be referred to as non-specified subkeys. It may be provided that a rule key contains only specified values, only wildcards or a suitable combination of specified values and wildcards.

The parameter sets each comprise at least one parameter, but a multiplicity of parameters is preferably provided.

A parameter set is preferably assigned a rule key. However, it may likewise be provided that a parameter set is assigned a plurality of rule keys.

During the step of comparing the data key read in with the rule keys stored in the parameter directory, in particular the respectively mutually corresponding subkeys of a data key and of a rule key are compared with one another. A match of the subkeys is ascertained if the value of the respective subkey of the data key matches the specified value of the rule key currently being considered. If the subkey of the rule key has a wildcard, a match is determined or ascertained for all the possible values of the respective subkey of the data key.

Preferably, the rule keys stored in the parameter directory are each assigned a rank and the step of determining a parameter set furthermore comprises a step of determining the rank assigned to the rule key(s) determined and, if more than one rule key whose subkeys match those of the data key read in has been determined, outputting the parameter set which is assigned to the rule key having the highest rank.

With the aid of the assignment of a rank to the rule keys, it is possible, if a plurality of rule keys matching the data key read in have been ascertained, to select in a simple manner that parameter set which is intended to be used for carrying out the process.

Preferably, the rank corresponds to the number of specified subkeys of a rule key.

In this way, for the read-in data key or the integrated circuit on which the process is intended to be carried out, those parameters are selected which are assigned to that rule key which has the most specified subkeys.

As an alternative or in addition, the individual subkeys may be assigned subranks and the rank results from the sum of the subranks of the specified subkeys.

Consequently, it is possible for individual subkeys or properties of the integrated circuit to be weighted more heavily than others. Particularly if a rank conflict occurs between rule keys, a rule key can be selected in a simple manner.

Furthermore, it may be provided that in the parameter directory each parameter set is assigned a parameter set name, and the method comprises the following steps of:
reading in a process name specifying what type of a process is to be carried out on the integrated circuit;
comparing the process name with the parameter set name (step 124); and
outputting the rule key(s) determined and the parameter set(s) assigned to the process name (step 126).

The process name specifies in particular what type of a process is intended to be carried out. It may be provided that, for different processes, the same rule key is assigned different parameter sets. Consequently, it is possible to distinguish between the different process types with the aid of the process name.

FIG. 2 illustrates a system for carrying out a process on an integrated circuit. The system comprises:
a reader 210 adapted to read in a data key comprising a plurality of subkeys;
a process parameter set determiner 220 adapted to determine a process parameter set using a parameter directory 240 in a manner dependent on the read data key; and
a setting device 230 adapted to set the parameters required for the process in accordance with the determined process parameter set,
wherein the parameter directory 240 comprises:
a plurality of rule keys each comprising a plurality of subkeys, the subkeys each being assigned predeterminable values from a plurality of values, and at least one subkey of at least one rule key being assigned a wildcard which can assume all the predeterminable values possible for the respective subkey;
a plurality of process parameter sets, each process parameter set respectively being assigned at least one rule key;
wherein the process parameter set determiner 220 further comprises:
a comparator 222 adapted to compare the data key read in with the rule keys stored in the parameter directory 240;
a rule key determiner 224 adapted to determine the rule key(s) whose subkeys match those of the read data key; and
an outputter 230 adapted to output the process parameter set(s) assigned to the determined rule key(s).

Further features, objects and advantages of the present application will become apparent from the following detailed description of preferred embodiments.

When testing integrated circuits, in particular semiconductor memory devices, it is necessary to define different test parameters for different semiconductor memory devices. The parameters required for the test may be e.g. voltage, current, timing, sorting, etc. parameters.

In accordance with one preferred embodiment, test parameters for all the semiconductor memory devices to be tested are stored in a test data file or parameter file.

In order to obtain from the parameter file parameters which are required for the test of a specific semiconductor memory device, a data key of the semiconductor memory device to be tested is created or determined. The properties of the semiconductor memory device that are significant for the test are defined in the data key.

A data key contains a plurality of subkeys which specify predeterminable properties of the semiconductor memory device to be tested. Furthermore, the subkeys may relate to the circumstances or conditions of the test to be carried out, such as e.g. the test device used, or to ambient parameters, such as e.g. the temperature. The individual subkeys of a data key are preferably separated from one another by strokes. An exemplary structure of a data key is explained in detail on the basis of the data key shown below:

data key: 128M_D_14_X04

The first subkey ("128M" in the present example) specifies the size of the semiconductor memory device to be tested. The size may be 128 MB, 256 MB, 512 MB, . . . , by way of example. The second subkey ("D" in the present example) specifies the product type in the present example. In this case, e.g. "D" specifies that double data rate DDR is provided for the semiconductor memory device. The third subkey ("14" in the present example) specifies the technology or feature size of the semiconductor memory device to be tested. In the present example, "14" corresponds to a 140 nm technology. The last subkey in the present example specifies the type of organization or configuration of the semiconductor memory device. The organization designates in particular the width of a data word, which physically corresponds to the number of data pins of the semiconductor memory device. By way of example, this subkey may assume the values X04, X08 or X16. It may furthermore be provided that a multiplicity of further properties of a semiconductor memory device are specified in the manner described above. Consequently, the semiconductor memory device to be tested can be specified in a simple manner with the aid of a data key.

In the parameter file, each parameter set is allocated a rule key. A rule key has a structure analogous to that of a data key. In particular, a rule key contains a plurality of subkeys which specify predeterminable properties of the semiconductor memory device to be tested, the subkeys of a rule key in each case corresponding to those of a data key. The individual subkeys of a rule key are likewise preferably separated from one another by strokes.

In a similar manner to the subkeys of the data keys, the subkeys of the rule keys are allocated predeterminable values. The subkeys are thus specified. It may furthermore be provided that one, a plurality or all of the subkeys of a rule key are not specified or do not have a predetermined value, but rather have a wildcard. The wildcard can assume all the values available for the respective subkey. In the present example, a wildcard is represented by a dot in the place of the respective subkey.

Table 1 below illustrates an exemplary entry in a parameter file. In this case, only one rule key is illustrated.

TABLE 1

| Name | Variant | Rule key | Param. 1 | Param. 2 |
|------|---------|----------|----------|----------|
| A | 1 | ._._._. | 1 V | Low |

Each parameter set or a group of parameter sets which relate to the same type of a test is allocated a name, "A" in the present example. The name specifies the type of a test for which the respective parameter set is valid. By way of example, functional tests or speed tests, in which the speed class of the semiconductor memory device is determined, may be provided. Furthermore, by way of example, timing tests, in which different time conditions are predefined as parameters, or level tests, in which different voltage values are predefined as parameters, may be carried out.

Furthermore, different variants of a parameter set may be provided, which are provided for semiconductor memory devices to be tested which differ for example only by virtue of different values of a property or of a subkey. Table 1 illustrates a rule key which has exclusively wildcards. By way of example, this rule key is allocated two parameters Param 1 and Param 2. However, a multiplicity of further parameters may be provided.

In the example shown in Table 1, the data key with essentially any arbitrary semiconductor memory device to be tested would match the rule key since the latter contains only wildcards.

A parameter file containing three parameter sets for semiconductor memory devices to be tested is shown in Table 2 below. In Table 2, a parameter set is in each assigned to one rule key. However, it may be provided that a parameter set is assigned to a plurality of rule keys.

TABLE 2

| Name | Variant | Rule key | Param. 1 | Param. 2 |
|------|---------|----------|----------|----------|
| A | 1 | 512M_._._. | 1 V | Low |
| A | 2 | 512M_._11_X16 | 0.95 V | Low |
| A | 3 | 512M_._90_. | 0.9 V | Low |

Table 2 shows three variants of a parameter set with names A. In the rule key assigned to the first variant (variant 1), only the size (512 MB) of the semiconductor memory device is specified. The other properties or subkeys have wildcards. For the second variant (variant 2), the technology and the organization are furthermore specified. In the third variant (variant 3), only the size and the technology are defined. The individual variants are allocated different parameters.

A description is given below of how, for a predetermined semiconductor memory device specified with the aid of a data key, an associated parameter set is determined from the parameter file. For this purpose, by way of example, the following data key is used: 512M_D_90_X16. Furthermore, the parameter sets shown in Table 2 are used.

In order to determine a valid variant of a parameter set for the abovementioned data key from the parameter file shown in Table 2, the individual subkeys of the data key and of the rule keys stored in the parameter file are respectively compared with one another. The subkeys of a rule key which are provided with a wildcard may in this case assume all the values provided for the respective subkey.

In the present example, a positive search result is produced for variant 1 since, in the rule key allocated to variant 1, only the first subkey is specified and the latter matches the first subkey of the data key. The other subkeys of variant 1 contain wildcards and can thus assume every available value. Furthermore, a positive search result is also produced for variant 3. In this variant, the third subkey is additionally specified. In the present example, the third subkey of the data key and of the rule key of variant 3 match. Consequently, two valid parameter sets are initially produced for the data key.

In order to select a specific one of the two parameter sets, a rank is preferably assigned to each parameter set or each rule key. In the present example, the rank results from the number of specified or defined subkeys. For variant 1, the rank is 1 since only the first subkey is specified. For variant 2, the rank is 3 since three subkeys are specified. For variant 3, the rank 2 results since two subkeys are specified. For the case where more than one rule key match the data key, that rule key which has the highest rank is selected (principle of higher rank priority). The assignment of the rank may be effected in the front end stage, that is to say before a test is carried out, or dynamically while the test is being carried out.

In the present example, the rank of variant 3 is two and the rank of variant 1 is one. The rank of variant 3 is thus greater than the rank of variant 1. As a consequence, variant 3 is selected and the parameters assigned to this rule key are selected for the test of the semiconductor memory device.

A test can subsequently be carried out using the test parameters determined.

As an alternative or in addition, it may be provided that the individual subkeys have different subranks. The individual subkeys or properties of the semiconductor memory device to be tested can thus be weighted. The weighting may be defined for example according to the importance of the respective properties of the semiconductor memory device to be tested. The total rank of a rule key then results from the sum of the subranks of the individual subkeys.

It may be provided that, for different process or test types, different parameter sets are assigned to the same rule key. This is shown by way of example in Table 3.

TABLE 3

| Name | Variant | Rule key | Param. 1 | Param. 2 |
|------|---------|----------|----------|----------|
| Timing set 1 | 1 | ._._._. | 1 ns | 4.3 ns |
| Timing set 2 | 1 | ._._._. | 1.1 ns | 4.3 ns |

In this case, the rule key ._._._. is provided both for timing set 1 and timing set 2. In the present example, timing set 1 and timing set 2 are designations for tests which have, in particular, different time conditions as parameters. If the intention is to determine a valid parameter set for a semiconductor memory device to be tested, firstly the name of the test type is taken as a basis for determining which rule keys are to be taken into account for the further selection. In particular, only those rule keys which correspond to the test type that has been input or the test types that have been input are checked.

By virtue of the principle of higher rank priority, the parameter file may contain a plurality of variants which are formally valid for a data key read in, without an assignment conflict occurring. It may furthermore be provided that, if a rank conflict occurs, an error message is output. The rule keys may be subsequently altered accordingly.

The method described above can be used to organize test parameters for different semiconductor memory devices to be tested and also for different variants of a test for a specific semiconductor memory device in a simple manner.

The provision of a parameter file used for testing semiconductor memory devices has the following advantages, in particular:

If a new variant and/or a new parameter set is added to the already existing variants and/or parameter sets, the previous variants or rule keys do not have to be altered. In particular, only a newly specified rule key with corresponding parameters is inserted into the parameter file.

Furthermore, no access conflicts arise when there are a plurality of users of the same parameter file. It may be provided, by way of example, that new variants are permitted to be added by all the users, whereas already existing variants or rule keys are permitted to be erased or altered only by predetermined persons.

The volume of data required for managing the test parameters can be greatly reduced by using wildcards in the rule keys. In particular, it is necessary to specify only those altered test parameters which have to be used for particularly specified semiconductor memory devices.

The present application is particularly advantageous in particular if the number of possible variants of the parameter sets is less than the total number of possible rule or data keys. The total number results, in particular, from all possible combinations of the different properties of semiconductor memory devices to be tested.

The method described above can also be applied to other areas in the production of integrated circuits; by way of example, it might be provided that different parameters are required during production. Consequently, production parameters could be stored in the parameter file in this case. Furthermore, any other possible application is conceivable.

What is claimed is:

1. A method for carrying out a process on an integrated circuit, comprising:
   reading in a data key comprising a plurality of data subkeys;
   determining a process parameter set using a parameter directory in a manner dependent on the read data key; and
   setting parameters required for the process in accordance with the determined process parameter set,
   wherein the parameter directory comprises:
      a plurality of rule keys each comprising a plurality of rule subkeys, the rule subkeys each being assigned predeterminable values from a plurality of values, and at least one rule subkey of at least one rule key being assigned a wildcard which can assume all the predeterminable values possible for the respective rule subkey; and
      a plurality of process parameter sets, each process parameter set respectively assigned at least one rule key;
   wherein the step of determining a process parameter set comprises:
      comparing the read data key with the rule keys stored in the parameter directory;
      determining the rule key(s) whose rule subkeys match those of the read data key; and
      outputting the process parameter set(s) assigned to the determined rule key(s).

2. The method as claimed in claim 1, wherein the rule keys stored in the parameter directory are each assigned a rank, and the step of determining a process parameter set further comprises:
   determining the rank assigned to the determined rule key(s); and
   if more than one rule key whose rule subkeys match those of the data key read in has been determined, outputting the process parameter set which is assigned to the rule key having the highest rank.

3. The method as claimed in claim 2, wherein the rank assigned to the determined rule key(s) corresponds to a number of specified rule subkeys of the respective rule key.

4. The method as claimed in claim 2, wherein the individual rule subkeys are assigned subranks and the rank is equal to the sum of the subranks of the specified rule subkeys.

5. The method as claimed in claim 1, wherein in the parameter directory each process parameter set is assigned a process parameter set name, and the method further comprises:
   reading in a process name specifying what type of a process is to be carried out on the integrated circuit;
   comparing the process name with the process parameter set name; and
   outputting the determined rule key(s) and the process parameter set(s) assigned to the process name.

6. A system for carrying out a process on an integrated circuit, comprising:
   a reader configured to read in a data key comprising a plurality of data subkeys;
   a process parameter set determiner configured to determine a process parameter set using a parameter directory in a manner dependent on the read data key; and
   a setting device configured to set the parameters required for the process in accordance with the determined process parameter set,
   wherein the parameter directory comprises:
      a plurality of rule keys each comprising a plurality of rule subkeys, the rule subkeys each being assigned predeterminable values from a plurality of values, and at least one rule subkey of at least one rule key being assigned a wildcard which can assume all the predeterminable values possible for the respective rule subkey;
      a plurality of process parameter sets, each process parameter set respectively being assigned at least one rule key;
   wherein the process parameter set determiner further comprises:
      a comparator configured to compare the read data key with the rule keys stored in the parameter directory;
      a rule key determiner configured to determine the rule key(s) whose rule subkeys match those of the read data key; and
      a outputter configured to output the process parameter set(s) assigned to the determined rule key(s).

7. A system for carrying out a process on an integrated circuit, comprising:
- a reading means for reading in a data key comprising a plurality of data subkeys;
- a process parameter set determining means for determining a process parameter set using a parameter directory in a manner dependent on the read data key; and
- a setting means for setting the parameters required for the process in accordance with the determined process parameter set,
- wherein the parameter directory comprises:
  - a plurality of rule keys each comprising a plurality of rule subkeys, the rule subkeys each being assigned predeterminable values from a plurality of values, and at least one rule subkey of at least one rule key being assigned a wildcard which can assume all the predeterminable values possible for the respective rule subkey;
  - a plurality of process parameter sets, each process parameter set respectively being assigned at least one rule key;
- wherein the determining means for determining a process parameter set further comprises:
  - a comparing means for comparing the read data key with the rule keys stored in the parameter directory;
  - a rule key determining means for determining the rule key(s) whose rule subkeys match those of the read data key; and
  - a outputting means for outputting the process parameter set(s) assigned to the determined rule key(s).

* * * * *